(12) United States Patent
Vogel et al.

(10) Patent No.: US 7,514,710 B2
(45) Date of Patent: Apr. 7, 2009

(54) BOTTOM GATE THIN FILM TRANSISTORS

(75) Inventors: Dennis E. Vogel, Lake Elmo, MN (US); Brian K. Nelson, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 228 days.

(21) Appl. No.: 11/275,367

(22) Filed: Dec. 28, 2005

(65) Prior Publication Data
US 2007/0158643 A1  Jul. 12, 2007

(51) Int. Cl.
*H01L 29/08* (2006.01)
*H01L 35/24* (2006.01)
*H01L 51/00* (2006.01)

(52) U.S. Cl. .............................. 257/40; 257/17; 257/59; 257/225; 257/642; 257/679; 257/E51.005; 257/E51.006; 257/E21.259

(58) Field of Classification Search .................. 257/40, 257/532, 642, 535, 310, 17, 59, 225, 679, 257/E51.005, E51.006, E51.049, E21.259
See application file for complete search history.

(56) References Cited

U.S. PATENT DOCUMENTS

| | | | |
|---|---|---|---|
| 6,326,640 B1* | 12/2001 | Shi et al. ........................ | 257/40 |
| 6,690,029 B1 | 2/2004 | Anthony et al. | |
| 6,713,389 B2 | 3/2004 | Speakman | |
| 6,913,944 B2* | 7/2005 | Hirai ............................ | 438/99 |
| 6,963,080 B2 | 11/2005 | Afzali-Ardakani et al. | |
| 7,061,010 B2* | 6/2006 | Minakata ...................... | 257/40 |
| 7,098,525 B2* | 8/2006 | Bai et al. ...................... | 257/642 |
| 2004/0222412 A1* | 11/2004 | Bai et al. ...................... | 257/40 |
| 2005/0017237 A1* | 1/2005 | Ong et al. ..................... | 257/40 |
| 2005/0104058 A1* | 5/2005 | Veres et al. ................... | 257/40 |
| 2005/0196775 A1* | 9/2005 | Swager et al. ................. | 435/6 |
| 2005/0274945 A1* | 12/2005 | Fallis et al. .................... | 257/40 |
| 2007/0023748 A1* | 2/2007 | Vogel et al. ................... | 257/40 |

FOREIGN PATENT DOCUMENTS

| | | |
|---|---|---|
| WO | WO 03/030278 A2 | 4/2003 |
| WO | WO 2005/055248 A2 | 6/2005 |

OTHER PUBLICATIONS

Kim et al. "An Organic Thin-Film Transistor of High Mobility by Dielectric Surface Modification with Organic Molecule" Dec. 27, 2004, American Institute of Physics, Applied Physics Letters, vol. 85, No. 26, pp. 6368-6370.*

(Continued)

*Primary Examiner*—M. Wilczewski
*Assistant Examiner*—Telly D Green
(74) *Attorney, Agent, or Firm*—Jean A. Lown

(57) ABSTRACT

A transistor is provided comprising: a substrate; a gate electrode; a semiconducting material not located between the substrate and the gate electrode; a source electrode in contact with the semiconducting material; a drain electrode in contact with the semiconducting material; and a dielectric material in contact with the gate electrode and the semiconducting material; wherein the semiconducting material comprises: 1-99.9% by weight of a polymer having a dielectric constant at 1 kHz of greater than 3.3; 0.1-99% by weight of a functionalized pentacene compound as described herein.

14 Claims, 1 Drawing Sheet

OTHER PUBLICATIONS

Sheraw et al. "Functionalized Pentacene Active Layer Organic Thin-Film Transistors", 2003, Wiley-VCH Verlag GmbJ & Co. KGaA, Journal, pp. 2009-2011.*

Park et al. "High Mobility Solution-Processed OTFT's", 2005 IEEE, Technical Digest-Interational Electron Devices, pp. 113-116.*

Payne et al. "Orgarnic Field-Effect Transistos from Solution-Deposited Functionalized Acenes with Mobilities as High as 1 cm2/V*s", Mar. 19, 2005, JACS(Journal of American Chemistry Society) Communications vol. 127, No. 14, pp. 4982-4987.*

Roy et al. "Metal-organic pentacene derivative with well ordered morphology for the application of low voltage organic thin film transistors" 2005, Proc. of SPIE, vol. 5940 pp. 59401L-1 to 59401L-7.*

Park et al. "Functionalized Pentacene Field-Effect Transistors with Logic Circuit Applications" 2003, VCH Verlagsgesellschaft, Germany, Advanced Materials, vol. 15, Part 23, pp. 2009-2001.*

He Yan, Myung-Han Yoon, Antonio facchetti, and Tobin J. Marks, "Organic Field-Effect Transistors Based On A Crosslinkable Polymer Blend As The Semiconductor Layer", Applied Physics Letters, 87, (18), 2002, pp. 18350-1-18350-3.

Naoki Yoshimoto and Jun-ichi Hanna, "Preparation Of A Novel Organic Semiconductor Composite Consisting Of A Liquid Crystalline Semiconductor And Crosslinked Polymer And Characterization Of Its Charge Carrier Transport Properties", Journal of Materials Chemistry, 13, 2003, pp. 1004-1010.

Joseph A. Letizia, Antonio Facchetti, Charlotte L. Stern, Mark A. Raner, and Tobin J. Marks, "High Electron Mobility In Solution-Cast And Vapor-Deposited Phenacyl-Quaterthiophene-Based Field-Effect Transistors: Toward N-Type Polythiophenes", Journal of American Chemical Society, Sep. 3, 2005, vol. 127, No. 39, pp. 13476-13477.

* cited by examiner

BOTTOM GATE THIN FILM TRANSISTORS

FIELD OF THE INVENTION

This invention relates to bottom gate thin film transistors including the semiconductor of the present disclosure. In some embodiments the semiconductor may be solvent coated over previously generated layers of the transistor during manufacture.

BACKGROUND OF THE INVENTION

U.S. Pat. No. 6,690,029 B1 purportedly discloses certain substituted pentacenes and electronic devices made therewith.

WO 2005/055248 A2 purportedly discloses certain substituted pentacenes and polymers in top gate thin film transistors.

SUMMARY OF THE INVENTION

Briefly, the present invention provides a transistor comprising: a substrate; a gate electrode; a semiconducting material not located between the substrate and the gate electrode; a source electrode in contact with the semiconducting material; a drain electrode in contact with the semiconducting material; and a dielectric material in contact with the gate electrode and the semiconducting material; wherein the semiconducting material comprises: 1-99.9% by weight of a polymer having a dielectric constant at 1 kHz of greater than 3.3; 0.1-99% by weight of a compound according to Formula I:

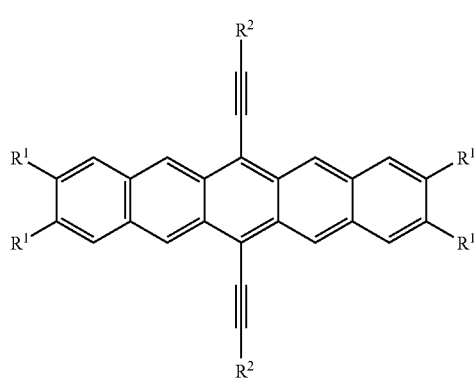

where each $R^1$ is independently selected from H and $CH_3$, more typically H, and each $R^2$ is independently selected from branched or unbranched C2-C18 alkanes, branched or unbranched C1-C18 alkyl alcohols, branched or unbranched C2-C18 alkenes, C4-C8 aryls or heteroaryls, C5-C32 alkylaryl or alkyl-heteroaryl, a ferrocenyl, or more typically $SiR^3{}_3$ where each $R^3$ is independently selected from hydrogen, branched or unbranched C1-C10 alkanes, branched or unbranched C1-C10 alkyl alcohols or branched or unbranched C2-C10 alkenes, where more typically each $R^3$ is independently selected from branched or unbranched C1-C10 alkanes. Most typically the compound according to formula I is 6,13-bis(triisopropylsilylethynyl)pentacene (TIPS-pentacene). The polymer having a dielectric constant at 1 kHz of greater than 3.3 is typically selected from the group consisting of: poly(4-cyanomethyl styrene) and poly(4-vinylphenol) and most typically is poly(4-vinylphenol).

Typical polymers may also include polymers containing cyano groups such as cyanopullulans. The source and drain electrodes may be in contact with the dielectric material or not in contact with the dielectric material.

DETAILED DESCRIPTION

Thin film transistors show promise in the development of lightweight, inexpensive and readily reproduced electronic devices, in particular where they may be made by solvent coating techniques, such as printing techniques.

Figure 1:
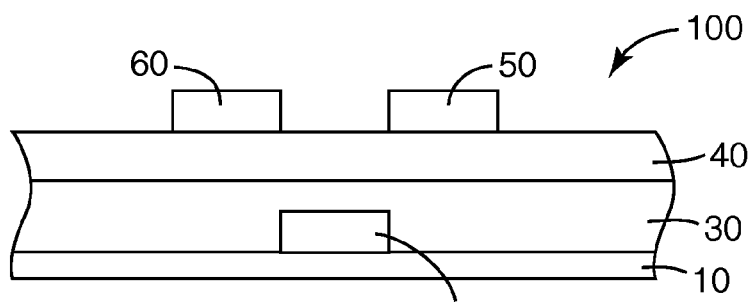
FIG. 1 is a schematic depiction of the layers present in a top contact/bottom gate thin film transistor.
Figure 2:
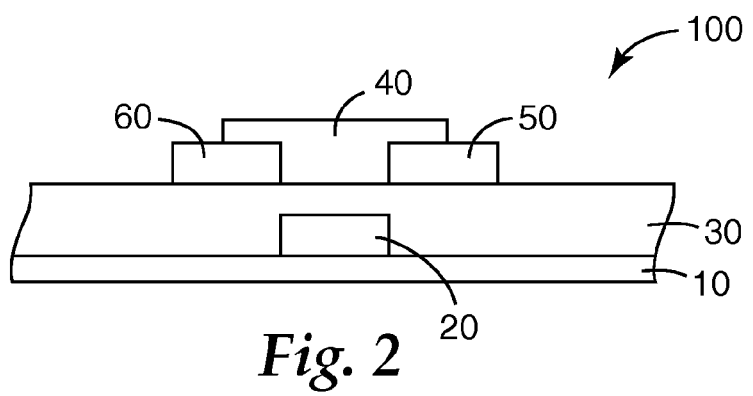
FIG. 2 is a schematic depiction of the layers present in a bottom contact/bottom gate thin film transistor.
Figure 3:
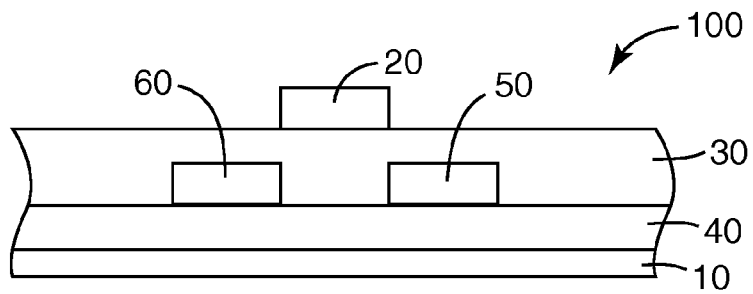
FIG. 3 is a schematic depiction of the layers present in a top contact/top gate thin film transistor.
Figure 4:
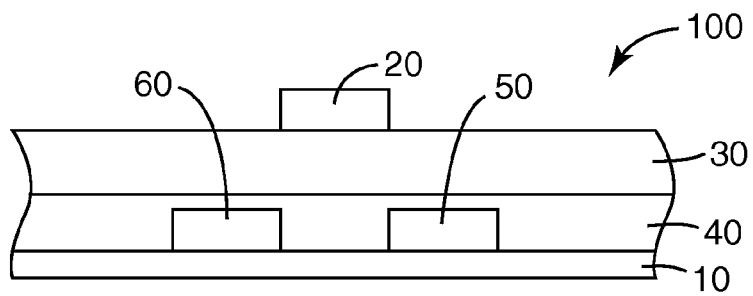
FIG. 4 is a schematic depiction of the layers present in a bottom contact/top gate thin film transistor.

Thin films transistors are known in four principle geometries. With reference to each of FIG. 1, representing a top contact/bottom gate thin film transistor, FIG. 2, representing a bottom contact/bottom gate thin film transistor, FIG. 3, representing a top contact/top gate thin film transistor, and FIG. 4, representing a bottom contact/top gate thin film transistor, thin film transistor 100 includes substrate 10, gate electrode 20, dielectric layer 30, semiconductor layer 40, source electrode 50, and drain electrode 60. Typically, each of the source electrode 50 and drain electrode 60 will overlap the gate electrode 20 to a slight extent.

In the top gate designs depicted in FIGS. 3 and 4, the gate electrode 20 is above the dielectric layer 30 and both the gate electrode 20 and the dielectric layer 30 are above the semiconductor layer 40. In the bottom gate designs depicted in FIGS. 1 and 2, the gate electrode 20 is below dielectric layer 30 and both the gate electrode 20 and the dielectric layer 30 are below the semiconductor layer 40. As a result, the manufacture of the bottom gate designs by solvent coating techniques requires a semiconductor that can be applied in solvent to previously coated dielectric layers without disruption of those layers.

The materials of the present invention permit the construction of a bottom gate transistor with a solvent coated semiconductor, due to the formulation of a semiconductor coating composition that can be coated over the dielectric. However, the semiconductor layer of the thin film transistor of the present disclosure may be made by any suitable method, including solvent coating methods, but also including dry methods, melt processing, vapor deposition, or the like. Where the semiconductor layer of the present disclosure is made by solvent coating methods, the materials of the semiconductor layer may be carried in any suitable solvent, which may include ketones, aromatic hydrocarbons, and the like. Typically the solvent is organic. Typically the solvent is aprotic.

The semiconductor layer according to the present disclosure includes a functionalized pentacene compound according to Formula I:

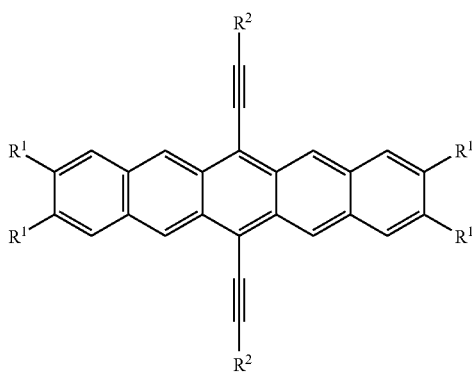

where each $R^1$ is independently selected from H and $CH_3$ and each $R^2$ is independently selected from branched or unbranched C2-C18 alkanes, branched or unbranched C1-C18 alkyl alcohols, branched or unbranched C2-C18 alkenes, C4-C8 aryls or heteroaryls, C5-C32 alkylaryl or alkylheteroaryl, a ferrocenyl, or $SiR^3{}_3$ where each $R^3$ is independently selected from hydrogen, branched or unbranched C1-C10 alkanes, branched or unbranched C1-C10 alkyl alcohols or branched or unbranched C2-C10 alkenes. Typically each $R^1$ is H. Typically, each $R^2$ is $SiR^3{}_3$. More typically each $R^2$ is $SiR^3{}_3$ and each $R^3$ is independently selected from branched or unbranched C1-C10 alkanes. Most typically, the compound is 6,13-bis(triisopropylsilylethynyl)pentacene (TIPS-pentacene), shown in formula II:

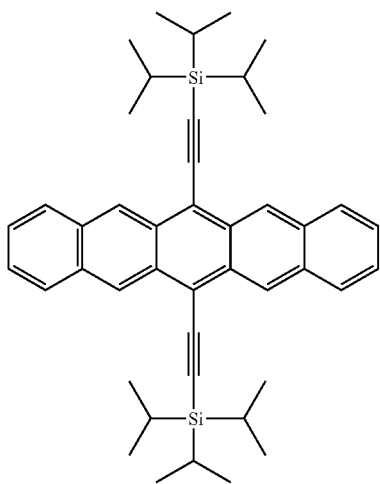

The semiconductor layer contains the compound of Formula I or of Formula II in an amount of 0.1-99% by weight, more typically 0.1-10%.

The semiconductor layer according to the present disclosure includes a polymer having a dielectric constant at 1 kHz of greater than 3.3, and more typically greater than 3.5, and in some embodiments may be greater than 4.0, and in some embodiments may be greater than 4.5. The polymer typically has a M.W. of at least 1,000 and more typically at least 5,000. Typical polymers include poly(4-cyanomethyl styrene) and poly(4-vinylphenol). Typical polymers may also include polymers containing cyano groups such as cyanopullulans.

Typical polymers also include those described in U.S. Patent Publication No. 2004/0222412 A1, incorporated herein by reference. Polymers described therein include substantially nonfluorinated organic polymers having repeat units of the formulas:

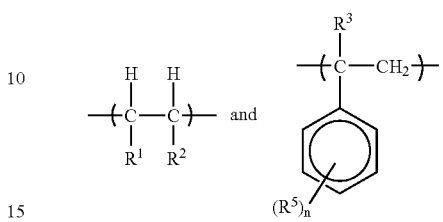

wherein:
each $R^1$ is independently H, Cl, Br, I, an aryl group, or an organic group that includes a crosslinkable group;
each $R^2$ is independently H, an aryl group, or $R^4$;
each $R^3$ is independently H or methyl;
each $R^5$ is independently an alkyl group, a halogen, or $R^4$;
each $R^4$ is independently an organic group comprising at least one CN group and having a molecular weight of about 30 to about 200 per CN group; and
n=0–3;
with the proviso that at least one repeat unit in the polymer includes an $R^4$.

The semiconductor layer contains the polymer in an amount of 1-99.9% by weight.

Objects and advantages of this invention are further illustrated by the following examples, but the particular materials and amounts thereof recited in these examples, as well as other conditions and details, should not be construed to unduly limit this invention.

EXAMPLES

Unless otherwise noted, all reagents were obtained or are available from Aldrich Chemical Co., Milwaukee, Wis., or may be synthesized by known methods.

Preparatory Example—Preparation of Polymer A

Polymer A is a nitrile-containing styrene-maleic anhydride copolymer that is described in U.S. Patent Publication No. 2004/0222412 A1, incorporated herein by reference. The synthesis is described therein at paragraphs 107 and 108 under the caption "Example 1, Synthesis of Polymer 1," as follows:

A 250-milliliter (mL), three-necked flask fitted with magnetic stirrer and nitrogen inlet was charged with 8.32 grams (g) 3-methyl aminopropionitrile (Aldrich) and a solution of 20.00 g styrene-maleic anhydride copolymer (SMA 1000 resin available from Sartomer, Exton, Pa.) in 50 mL of anhydrous dimethylacrylamide (DMAc, Aldrich). After the mixture was stirred for 30 minutes (min) at room temperature, N,N-dimethylaminopyridine (DMAP) (0.18 g, 99%, Aldrich) was added and the solution was then heated at 110° C. for 17 hours (h). The solution was allowed to cool to room temperature and was slowly poured into 1.5 liters (L) of isopropanol while stirred mechanically. The yellow precipitate that formed was collected by filtration and dried at 80° C. for 48 h at reduced pressure (approximately 30 millimeters (mm) Hg). Yield: 26.0 g.

Twenty grams (20 g) of this material was dissolved in 50 mL anhydrous DMAc followed by the addition of 28.00 g glycidyl methacrylate (GMA) (Sartomer), 0.20 g hydroquinone (J. T. Baker, Phillipsburg, N.J.) and 0.5 g N,N-dimethylbenzylamine (Aldrich). The mixture was flashed with nitrogen and then was heated at 55° C. for 20 h. After the solution was allowed to cool to room temperature, it was poured slowly into 1.5 L of a mixture of hexane and isopropanol (2:1, volume:volume (v/v), GR, E.M. Science) with mechanical stirring. The precipitate that formed was dissolved in 50 mL acetone and precipitated twice, first into the same solvent mixture as used above and then using isopropanol. The solid (Polymer A) was collected by filtration and was dried at 50° C. for 24 h under reduced pressure. (approximately 30 mm Hg). Yield: 22.30 g. FT-IR (film): 3433, 2249, 1723, 1637, 1458, 1290, 1160, and 704 $cm^{-1}$. Mn (number average molecular weight)=8000 grams per mole (g/mol), Mw (weight average molecular weight)=22,000 g/mol. Tg=105° C. Dielectric constant approximately 4.6.

Preparatory Example—Preparation of Solutions A-E

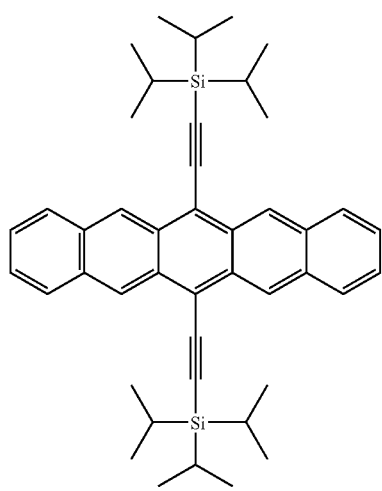

[II]

Solutions of 6,13-bis(triisopropylsilylethynyl)pentacene (TIPS-pentacene), shown in Formula II, and a high dielectric constant polymer were made with the compositions indicated in Table I. TIPS-pentacene was synthesized as disclosed in U.S. Pat. No. 6,690,029 B1 at Example 1. Poly(4-vinylphenol) MW 9,000 to 11,000 Sp.gr. 1.16 (PVP) was obtained from Polyscience, Inc. Warrington, Pa. Poly(4-cyanomethyl styrene) was made by the method described for "polymer 4" in U.S. Patent Publication No. 2004/0222412 A1. All solutions were prepared by mixing the components overnight and filtering the resulting mixture through a 0.2 micron filter.

Examples 1-11

Test transistors examples 1-10 were made on single crystal (i.e., <100> orientation), heavily doped, p-type silicon wafers that were obtained from Silicon Valley Microelectronics (San Jose, Calif.). The wafers as purchased have a 1000 Å layer of high temperature thermal silicon oxide layer on one face and a 5000 Å layer of aluminum metal vapor deposited on the opposite face. In this configuration, the doped wafer capped with aluminum served as the gate electrode and the silicon oxide functioned as the gate dielectric when organic thin film transistors (OTFTs) were prepared. For examples 1-8, solution A, B, C, D or E was applied by either spin coating or knife coating method followed by either air drying or an anneal step (heating to 120° C. for 10 minutes), as noted in Table 11. Knife coating was accomplished with a Gardco 4" micron film coater by application of a portion of the solution to the knife edge and pulling the coated over the substrate. Spin coating was accomplished according to the following protocol: 1st stage 500 RPM for 10 sec Acceleration 2 (166 rpm/sec), 2nd stage 2000 RPM for 20 sec Acceleration 4 (332 rpm/sec). The devices were completed by patterned vapor deposition of gold source and drain electrodes through a shadow mask onto the semiconductor layer. The devices had a channel length of 60 to 100 μm and a channel width of 1000 μm. Bottom contact device example 9 was made by patterned vapor deposition of gold source and drain electrodes through a shadow mask onto the dielectric to give a channel length of 60 to 100 μm and a channel width of 1000 μm. The semiconductor was then knife coated over the entire structure. Bottom contact device examples 10 and 11 were made by first inkjet printing silver nanoparticle ink onto the dielectric layer (Inkjet Silver Conductor, AG-IJ-100-S1, bulk resistivity 4-32 μΩ cm, from Cabot Printable Electronics and Displays, Albuquerque, N. Mex., Batch AG-062005-A). The sample was then cured at 125° C. for 11 minutes followed by treating the sample with a 0.1 mmol solution of perfluorothiophenol in toluene for 1 hour. The indicated semiconductor solution was deposited by knife coating over the entire structure and the sample was allowed to air dry or annealed at 120° C. for 10 minutes.

Transistor performance was tested at room temperature in air using a Semiconductor Parameter Analyzer (model 4145A from Hewlett-Packard, Palo Alto, Calif.). The square root of the drain-source current ($I_{ds}$) was plotted as a function of gate-source bias ($V_{gs}$), from +10 V to −40 V for a constant drain-source bias ($V_{ds}$) of −40 V. Using the equation:

$$I_{ds} = \mu C \times W/L \times (V_{gs} - V_t)^2 / 2$$

the saturation field effect mobility was calculated from the linear portion of the curve using the specific capacitance of the gate dielectric (C), the channel width (W) and the channel length (L). The x-axis extrapolation of this straight-line fit was taken as the threshold voltage (Vt). Table II displays the results of the various devices.

TABLE I

| Soln. | Polymer | TIPS-pentacene | Solvent |
|---|---|---|---|
| A | 10 wt % poly(4-vinylphenol) | 0.8 wt % | cyclohexanone |
| B | 10 wt % Polymer A | 1.0 wt % | isophorone |
| C | 0.5 wt % poly(4-cyanomethyl styrene) | 0.5 wt % | cyclohexanone |
| D | 5.0 wt % poly(4-vinylphenol) | 0.50 wt % | cyclohexanone |
| E | 10.0 wt % poly(4-vinylphenol) | 0.50 wt % | cyclohexanone |

TABLE II

| Ex. | Design | Coating | Solution | Mobility (cm²/v-s) |
|---|---|---|---|---|
| 1 | TC/BG | Spin | A | $10^{-3}$ |
| 2 | TC/BG | Spin/Anneal | B | $10^{-2}$ |
| 3 | TC/BG | Knife/Anneal | A | $10^{-2}$ |
| 4 | TC/BG | Knife | A | $10^{-3}$ |
| 5 | TC/BG | Knife | B | $2 \times 10^{-2}$ |
| 6 | TC/BG | Knife | C | $2 \times 10^{-3}$ |
| 7 | TC/BG | Knife | D | $10^{-3}$ |

TABLE II-continued

| Ex. | Design | Coating | Solution | Mobility (cm$^2$/v-s) |
|---|---|---|---|---|
| 8 | TC/BG | Knife | E | $10^{-3}$ to $10^{-4}$ |
| 9 | BC/BG | Knife | E | $10^{-7}$ |
| 10 | BC/BG | Knife/Anneal | A | $10^{-2}$ |
| 11 | BC/BG | Knife | A | $10^{-6}$ |

Various modifications and alterations of this invention will become apparent to those skilled in the art without departing from the scope and principles of this invention, and it should be understood that this invention is not to be unduly limited to the illustrative embodiments set forth hereinabove.

What is claimed is:

1. A transistor comprising:
   a substrate;
   a gate electrode;
   a semiconductor layer not located between the substrate and the gate electrode;
   a source electrode in contact with the semiconducting material;
   a drain electrode in contact with the semiconducting material; and
   a dielectric material in contact with the gate electrode and the semiconducting material;
   wherein the semiconductor layer comprises a semiconducting material mixture comprising:
   (a) 1-99.9% by weight of a polymer having a dielectric constant at 1 kHz of greater than 3.3;
   (b) 0.1-99% by weight of a compound according to Formula I:

[I]

where each $R^1$ is independently selected from H and $CH_3$ and each $R^2$ is independently selected from branched or unbranched C2-C18 alkanes, branched or unbranched C1-C18 alkyl alcohols, branched or unbranched C2-C18 alkenes, C4-C8 aryls or heteroaryls, C5-C32 alkylaryl or alkylheteroaryl, a ferrocenyl, or $SiR^3_3$ where each $R^3$ is independently selected from hydrogen, branched or unbranched C1-C10 alkanes, branched or unbranched C1-C10 alkyl alcohols or branched or unbranched C2-C10 alkenes.

2. The transistor according to claim 1 where each $R^1$ is H and each $R^2$ is $SiR^3_3$ where each $R^3$ is independently selected from hydrogen, branched or unbranched C1-C10 alkanes, branched or unbranched C1-C10 alkyl alcohols or branched or unbranched C2-C10 alkenes.

3. The transistor according to claim 1 where each $R^1$ is H and each $R^2$ is $SiR^3_3$ where each $R^3$ is independently selected from branched or unbranched C1-C10 alkanes.

4. The transistor according to claim 1 where the compound according to formula I is 6,13-bis(triisopropylsilylethynyl) pentacene (TIPS-pentacene).

5. The transistor according to claim 1 where the polymer having a dielectric constant at 1 kHz of greater than 3.3 is selected from the group consisting of: poly(4-cyanomethyl styrene) and poly(4-vinylphenol).

6. The transistor according to claim 4 where the polymer having a dielectric constant at 1 kHz of greater than 3.3 is selected from the group consisting of: poly(4-cyanomethyl styrene) and poly(4-vinylphenol).

7. The transistor according to claim 1 where the polymer having a dielectric constant at 1 kHz of greater than 3.3 is poly(4-vinylphenol).

8. The transistor according to claim 4 where the polymer having a dielectric constant at 1 kHz of greater than 3.3 is poly(4-vinylphenol).

9. The transistor according to claim 1 where the polymer having a dielectric constant at 1 kHz of greater than 3.3 is a polymer comprising cyano groups.

10. The transistor according to claim 4 where the polymer having a dielectric constant at 1 kHz of greater than 3.3 is a polymer comprising cyano groups.

11. The transistor according to claim 1 where the polymer having a dielectric constant at 1 kHz of greater than 3.3 is a substantially nonfluorinated organic polymer having repeat units of the formulas:

wherein:
   each $R^1$ is independently H, Cl, Br, I, an aryl group, or an organic group that includes a crosslinkable group;
   each $R^2$ is independently H, an aryl group, or $R^4$;
   each $R^3$ is independently H or methyl;
   each $R^5$ is independently an alkyl group, a halogen, or $R^4$;
   each $R^4$ is independently an organic group comprising at least one CN group and having a molecular weight of about 30 to about 200 per CN group; and
   n=0–3;
   with the proviso that at least one repeat unit in the polymer includes an $R^4$.

12. The transistor according to claim 4 where the polymer having a dielectric constant at 1 kHz of greater than 3.3 is a substantially nonfluorinated organic polymer having repeat units of the formulas:

wherein:

each $R^1$ is independently H, Cl, Br, I, an aryl group, or an organic group that includes a crosslinkable group;
each $R^2$ is independently H, an aryl group, or $R^4$;
each $R^3$ is independently H or methyl;
each $R^5$ is independently an alkyl group, a halogen, or $R^4$;
each $R^4$ is independently an organic group comprising at least one CN group and having a molecular weight of about 30 to about 200 per CN group; and
n=0–3;
with the proviso that at least one repeat unit in the polymer includes an $R^4$.

13. The transistor according to claim 1 wherein the source and drain electrodes are in contact with the dielectric material.

14. The transistor according to claim 1 wherein the source and drain electrodes are not in contact with the dielectric material.

* * * * *

UNITED STATES PATENT AND TRADEMARK OFFICE
CERTIFICATE OF CORRECTION

PATENT NO. : 7,514,710 B2  Page 1 of 1
APPLICATION NO. : 11/275367
DATED : April 7, 2009
INVENTOR(S) : Dennis E. Vogel It is certified that error appears in the above-identified patent and that said Letters Patent is hereby corrected as shown below:

Title Page; item (56); Page 2

Column 1, Other Publications; Line 5, Delete "Interational" and insert -- International --, therefor.

Column 1, Other Publications; Line 6, Delete "Orgarnic" and insert -- Organic --, therefor.

Column 1, Other Publications; Line 6, Delete "Transistos" and insert -- Transistors --, therefor.

Column 2, Other Publications; Line 3, Delete "Semiconductor" and insert -- Semiconducting --, therefor.

Column 6

Line 15, Delete "Table 11." and insert -- Table II. --, therefor.

Column 7

Line 30, In Claim 1, after "3.3;" insert -- and --, therefor.

Signed and Sealed this

Fourth Day of May, 2010

David J. Kappos
*Director of the United States Patent and Trademark Office*